United States Patent [19]
Cann et al.

[11] Patent Number: 5,342,660
[45] Date of Patent: Aug. 30, 1994

[54] METHOD FOR PLASMA JET DEPOSITION

[75] Inventors: Gordon L. Cann; Cecil B. Shepard, Jr., both of Laguna Beach, Calif.

[73] Assignee: Celestech, Inc., Irvine, Calif.

[21] Appl. No.: 698,538

[22] Filed: May 10, 1991

[51] Int. Cl.⁵ .............................................. B05D 3/06
[52] U.S. Cl. ......................... 427/577; 427/569;
427/249; 427/122; 427/258.5; 423/446;
118/723 E; 118/729; 118/730
[58] Field of Search ................. 427/38, 34, 39, 37,
427/249, 255.5, 255.4, 122, 569, 577; 423/446;
118/729, 730, 723 E; 156/DIG. 68

[56] References Cited

U.S. PATENT DOCUMENTS

| | | | |
|---|---|---|---|
| 4,471,003 | 9/1984 | Cann | 427/34 |
| 4,487,162 | 12/1984 | Cann | 118/723 |
| 4,505,947 | 3/1985 | Vukanovic et al. | 427/34 |
| 4,507,588 | 3/1985 | Asmussen et al. | 315/39 |
| 4,585,668 | 4/1986 | Asmussen et al. | 427/38 |
| 4,596,718 | 6/1986 | Gruner | 427/446 |
| 4,630,566 | 12/1986 | Asmussen et al. | 118/50.1 |
| 4,691,662 | 9/1987 | Roppel et al. | 118/50.1 |
| 4,728,863 | 3/1988 | Wertheimer | 315/111.21 |
| 4,913,090 | 4/1990 | Harada et al. | 118/724 |
| 4,987,002 | 1/1991 | Sakamoto et al. | 427/34 |
| 5,094,878 | 3/1992 | Yamamoto et al. | 427/577 |
| 5,204,145 | 4/1993 | Gasworth | 427/577 |

FOREIGN PATENT DOCUMENTS

| | | |
|---|---|---|
| 63-289926 | 11/1988 | Japan . |
| 01-242141 | 9/1989 | Japan . |
| 01-312008 | 12/1989 | Japan . |
| 02-60103 | 2/1990 | Japan . |
| 02-167891 | 6/1990 | Japan . |

Primary Examiner—Roy V. King
Attorney, Agent, or Firm—Martin Novack

[57] ABSTRACT

The disclosure is directed to a method for depositing a substance, such as synthetic diamond. A plasma beam is produced, and contains the constituents of the substance to be deposited. A substrate is provided, and has a surface in the path of the beam, the area of said surface being substantially larger than the cross-sectional area of the beam impinging on the surface. Repetitive motion is introduced between the substrate and the beam as the substance is deposited on the surface. The substrate, the beam, or both can be moved. Spinning of the substrate, with the beam non-concentric thereon, is one of the disclosed techniques.

16 Claims, 2 Drawing Sheets

METHOD FOR PLASMA JET DEPOSITION

RELATED APPLICATION

The present application is generally related to my copending U.S. patent application Ser. No. 698,446, filed of even date herewith now U.S. Pat. No. 5,204,124, and assigned to the same assignee as the present application.

FIELD OF THE INVENTION

This invention relates to plasma deposition of substances and, more particularly, to plasma deposition on a substrate of films of material such as synthetic diamond by techniques utilizing a plasma jet.

BACKGROUND OF THE INVENTION

Techniques for depositing substances, such as layers of semiconductor material, using a plasma that is formed into a jet, are well known. For example, my U.S. Pat. Nos. 4,471,003 and 4,487,162 disclose arc jet plasma deposition equipment which utilizes a plasma for deposition of semiconductors and other materials. Ions and electrons are obtained by injecting an appropriate compound, such as a silicon compound, into an arc region, and a jet (or beam) is formed by utilizing magnetic fields to accelerate and focus the plasma. Recently, equipment of this type has been used to deposit synthetic diamond. Superior physical and chemical properties make diamond desirable for many mechanical, thermal, optical and electronic applications, and the ability to deposit synthetic diamond by plasma jet deposition holds great promise, particularly if plasma jet techniques can be improved for this and other purposes.

In plasma jet deposition techniques there are various factors which limit the practical size of the deposition area that is active on a substrate at a particular moment. For example, when an arc is employed to generate the heated gas mixture in an arc jet plasma deposition system, the diameter of the effluent beam can be limited by a number of factors. For practical reasons the orifice from the arc chamber is of limited area. If the gas is expanded supersonically, the exit area of the nozzle will be determined by the pumping rate of the vacuum pumping system, so the vacuum pumping capability is a limiting factor in this regard. Expansion of the gas subsonically can result in heat transfer to the nozzle walls and significantly reduce the gas enthalpy. Also, the number density of key species in the flow can be degraded by volume reactions. Further, overly expanding the beam can diminish economic efficiency since the diamond yield may depend on the carbon impingement rate or upon the power density.

In various commercial applications it is desirable, or may become desirable, to have relatively large size diamond films. Since, for reasons just summarized, among others, the cross-section of the plasma beam is generally limited in practical applications, the area on which it is desired to deposit a diamond film may be many times larger than the deposition beam. This means that the beam and the target substrate need to be moved with respect to each other during the deposition process, which gives rise to a number of problems. The film will have a temperature gradient associated with power density from the impinging jet, and the film will tend to experience thermal cycling as the substrate moves with respect to the beam. The temperature gradients and/or thermal cycling tend to stress the diamond film, and can cause it to crack or spall off the substrate. Even if the film remains intact on the substrate, it may contain internal stress defects that can render it unacceptable for the purpose for which it was intended.

It is among the objects of the present invention to provide an apparatus and method which is responsive to the prior art limitations and problems described above and which facilitates production of relatively large area films, such as diamond films, of improved properties and with improved production efficiency.

SUMMARY OF THE INVENTION

In accordance with a feature of the present invention, the temperature variation of a substrate and a substance being deposited thereon is controlled, both temporally and spatially, by moving the substrate and the deposition beam with respect to each other at a rate which results in no more than a certain maximum temperature variation for specified operating conditions.

The invention is directed to a method and apparatus for depositing a substance, such as synthetic diamond. A plasma beam is produced, and contains the constituents of the substance to be deposited. [As used herein, the term "beam" is intended to generically include the terms beam and jet.] A substrate is provided, and has a surface (that is, at least one surface) in the path of the beam, the area of said surface being substantially larger than the cross-sectional area of the beam impinging on the surface. Repetitive motion (that is, motion in a pattern that substantially repeats) is introduced between the substrate and the beam as the substance is deposited on the surface. The substrate, the beam, or both can be moved. Spinning of the substrate, with the beam non-concentric thereon, is one preferred technique. The substrate can be tilted at a substantial angle (at least 10 degrees) with respect to the plane perpendicular to the beam direction, and the step of repetitively moving the substrate with respect to the beam may comprise moving the substrate back and forth with a component of motion perpendicular to the direction of the beam.

In general, when spinning of the substrate is employed, a rotation rate of at least about 500 rpm is preferred, with substantially higher rates of several thousand rpm being recommended for most situations. As described hereinbelow, factors such as the beam energy, the beam and substrate coverage geometries, and the properties of the substrate material all enter into the computation of the velocity (of the substrate and beam with respect to each other) that is necessary to keep temperature variations under control. Selection of substrate materials having favorable properties, particularly density and thermodynamic properties, will tend to reduce the velocity needed to attain a particular temperature deviation limit. Copper, tungsten, molybdenum, tungsten carbide, and molybdenum carbide have relatively favorable properties. Other attributes which should be taken into account pertain to the compatibility with the substance being deposited, including retention of the substance on the substrate, and the relative coefficients of expansion.

Further features and advantages of the invention will become more readily apparent from the following detailed description when taken in conjunction with the accompanying drawings.

DETAILED DESCRIPTION

Figure 1:
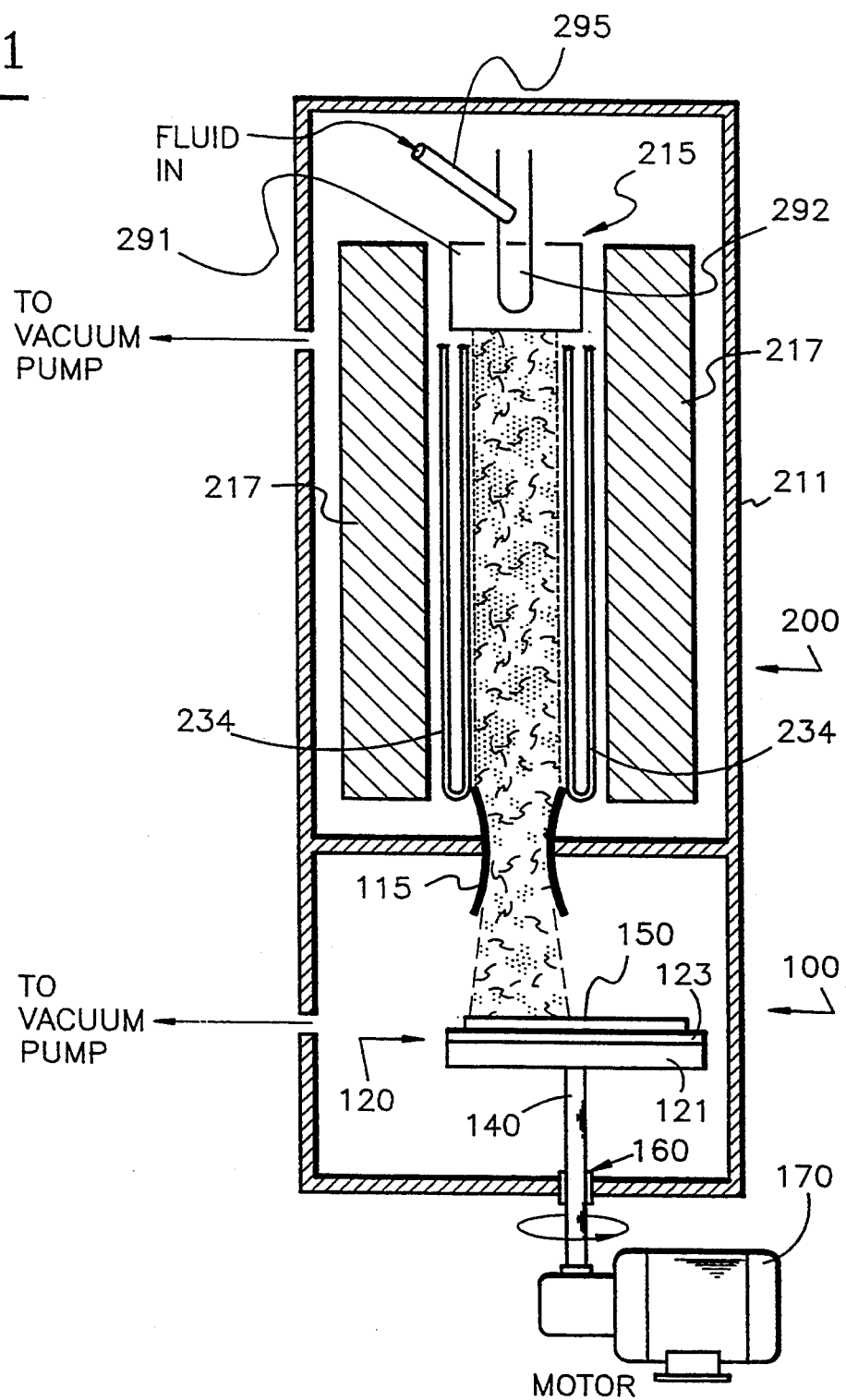
FIG. 1 is a diagram, partially in schematic form, of an apparatus in accordance with an embodiment of the invention and which can be utilized to practice an embodiment of the method of the invention.

Referring to FIG. 1, there is shown an embodiment of an apparatus in accordance with the invention and which can be used to practice an embodiment of a method the invention. A deposition chamber 100 is the lower section of a plasma jet deposition system 200, evacuated by one or more vacuum pumping systems (not shown).

The system 200 is contained within a vacuum housing 211 and includes an arc-forming section 215 which comprises a cylindrical anode 291, a rod-like cathode 292, and an injector 295 mounted adjacent the cathode so as to permit injected fluid to pass over the cathode. In the illustrated embodiment the input fluid may be, for example, a mixture of hydrogen and methane. The methane could alternatively be fed in downstream. The anode 291 and cathode 292 are energized by a source of electric potential (not shown), for example a DC potential. Cylindrical magnets, designated by reference numeral 217, are utilized to accelerate and focus the plasma generated at the arc forming section. The magnets maintain the plasma within a narrow column until the plasma reaches the deposition region. A nozzle, represented at 115, can be used to control beam size, within limitations. Cooling coils 234, in which liquid nitrogen can be circulated, are located within the magnets and surround the focused plasma.

In an example of operation, a mixture of hydrogen and methane is fed to the injector 295, and a plasma is obtained in front of the arc forming section and accelerated and focused toward the deposition region. As is known in the art, synthetic polycrystalline diamond can be formed from the described plasma, as the carbon in the methane is selectively deposited as diamond, and the graphite which forms is dissipated by combination with the hydrogen facilitating gas. For further description of plasma jet deposition systems, reference can be made to U.S. Pat. Nos. 4,471,003 and 4,487,162. It will be understood that other suitable types of plasma beam deposition equipment can be used in conjunction with the features of the invention to be described.

The deposition chamber 100 contains a substrate holder 120 which is mounted on a shaft 140. The holder 120 includes a base 121, and a radiator 123 or other suitable device can be mounted on the base, if necessary or desired. A substrate 150 is mounted on the holder 120, such as by retainer bolts (not shown). [As used herein, the term "substrate" is intended to mean an object having at least one surface on which a substance is to be deposited. It will be understood that a substrate may only temporarily hold a deposited layer which is intended for subsequent removal from the substrate. A substrate may also be an object on which the deposited surface is intended to be permanently affixed; for example, the substrate may be the base of a wear surface of deposited synthetic diamond, such as for ultimate use in a tool.] The shaft 140, non-concentric with the beam, extends through a vacuum-tight feed-through 160 to a motor 170 which spins the shaft 140, holder 120, and substrate 150 at a desired rate during the deposition process. Alternatively, the motor could be located within the vacuum chamber.

Figure 2:
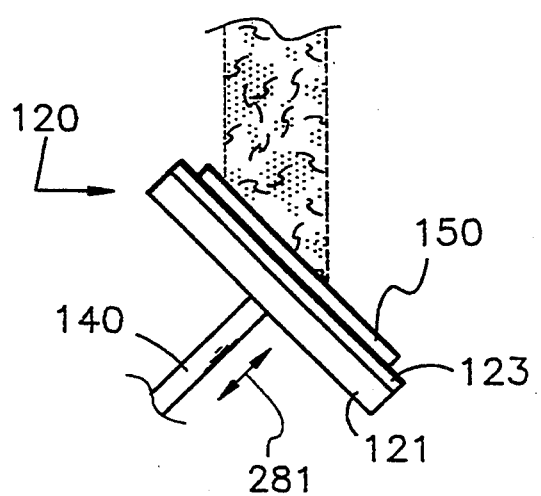
FIG. 2 is a diagram, partially broken away, of a portion of the FIG. 1 apparatus in accordance with another embodiment of the invention.
Figure 3:
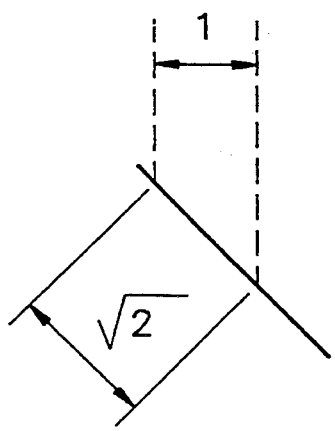
FIG. 3 illustrates the beam impingement area of the FIG. 2 embodiment.

For certain applications, the substrate can be tilted at a substantial angle with respect to the plane perpendicular to the beam direction. This is illustrated in FIG. 2, wherein the substrate 150 is at a substantial angle with respect to the beam 225. [The tilt can be introduced in either the substrate or the beam.] In this example, the plane of the holder 120 (and the corresponding plane of the substrate 150) is at an angle of about 45 degrees with respect to the plane (illustrated by dashed line 295) that is perpendicular to the direction of beam 225. As seen in FIG. 3, for this case the diameter of beam impingement on the substrate is the square root of 2 times the beam diameter. A reciprocating motion (see double-headed arrow 281) can be imparted to the shaft 140 by a reciprocating motor 287 to achieve repetitive coverage on the substrate. If desired, this can be in conjunction with rotating motion imparted to the shaft. However, as such combination of motions can be relatively difficult to implement, a component of motion can be introduced in the plasma beam, such as by introducing controlled gas dynamic instabilities.

Consider the case of a generally cylindrical beam with a generally circular impingement spot on a substrate moving at a velocity V. The beam will cause the spot temperature to change with respect to the substrate by $$\Delta T = qr/K(\pi B)^{\frac{1}{2}} \qquad (1)$$

where $$B = \rho V c_p r / K$$

and q = heat flux
r = radius of source (beam)
K = thermal conductivity of material
$\rho$ = density of material
$c_p$ = specific heat of material
V = linear velocity of heat source For a particular heat flux and beam geometry, $\Delta T$ will tend to decrease as B increases. B, in turn, will increase with increasing velocity. B also depends on the density and the thermodynamic properties of the substrate material. Selection of substrate materials having favorable properties (i.e., which tend to increase B) will tend to reduce the velocity needed to attain a particular temperature deviation limit. Copper, tungsten, molybdenum, tungsten carbide, and molybdenum carbide have relatively favorable properties for this purpose. Other attributes which should be taken into account pertain to the compatibility with the substance being deposited, including retention of the substance on the substrate, and the relative coefficients of expansion. For a given material, the velocity necessary to have no more than a certain maximum temperature increase can be determined from relationship (1), empirically, or by other suitable means.

We claim:

1. A method for depositing synthetic diamond, comprising the steps of:

producing a plasma beam containing a carbonaceous gas and hydrogen gas;

providing a substrate having a surface in the path of said beam, the area of said surface being larger than the cross-sectional area of said beam impinging on said surface; and spinning the substrate with respect to said beam to control temperature variation on said surface as the beam deposits said synthetic diamond on said surface.

2. The method as defined by claim 1, wherein said step of spinning said substrate comprises spinning said substrate at a rate of at least 500 revolutions per minute.

3. The method as defined by claim 1, wherein said substrate is tilted at an angle of at least 10 degrees with respect to the plane perpendicular to the beam direction.

4. The method as defined by claim 2, wherein said substrate is tilted at an angle of at least 10 degrees with respect to the plane perpendicular to the beam direction.

5. The method as defined by claim 3, further comprising moving said substrate back and forth with a component of motion perpendicular to the direction of said beam.

6. The method as defined by claim 4, further comprising moving said substrate back and forth with a component of motion perpendicular to the direction of said beam.

7. The method as defined by claim 1, wherein said substrate comprises a material selected from the group consisting of cooper, tungsten, molybdenum, tungsten carbide, and molybdenum carbide.

8. The method as defined by claim 4, wherein said substrate comprises a material selected from the group consisting of copper, tungsten, molybdenum, tungsten carbide, and molybdenum carbide.

9. The method as defined by claim 1, wherein said spinning step comprises spinning said substrate on an axis that is not concentric with the beam.

10. The method as defined by claim 2, wherein said spinning step comprises spinning said substrate on an axis that is not concentric with the beam.

11. A method for depositing a substance, comprising the steps of:

producing a plasma beam containing the constituents of said substance;

providing a substrate having a surface in the path of said beam, the substrate being tilted at an angle of at least 10 degrees with respect to the plane perpendicular to the beam direction; and introducing repetitive motion between said substrate and said beam as said substance is deposited on said surface.

12. The method as defined by claim 11, wherein said step of introducing repetitive motion between said substrate and said beam comprises spinning said substrate.

13. The method as defined by claim 12, wherein said step of spinning said substrate comprises spinning said substrate at a rate of at least 500 revolutions per minute.

14. The method as defined by claim 11, wherein said step of introducing repetitive motion between said substrate and said beam includes moving said substrate back and forth with a component of motion perpendicular to the direction of said beam.

15. The method as defined by claim 13, wherein said step of introducing repetitive motion between said substrate and said beam includes moving said substrate back and forth with a component of motion perpendicular to the direction of said beam.

16. The method as defined by claim 11, wherein said plasma beam contains a carbonaceous gas and hydrogen gas, and said substance is synthetic diamond.

* * * * *